United States Patent
Fukuda (10) Patent No.: US 9,245,753 B2
(45) Date of Patent: Jan. 26, 2016

(54) METHOD OF MANUFACTURING SEMICONDUCTOR DEVICE AND SEMICONDUCTOR DEVICE

(71) Applicant: SHINDENGEN ELECTRIC MANUFACTURING CO., LTD., Chiyoda-ku, Tokyo (JP)

(72) Inventor: Yusuke Fukuda, Hanno (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 14/407,457

(22) PCT Filed: Jun. 14, 2013

(86) PCT No.: PCT/JP2013/066453
§ 371 (c)(1),
(2) Date: Dec. 11, 2014

(87) PCT Pub. No.: WO2014/199510
PCT Pub. Date: Dec. 18, 2014

(65) Prior Publication Data
US 2015/0348783 A1 Dec. 3, 2015

(51) Int. Cl.
*H01L 21/428* (2006.01)
*H01L 21/04* (2006.01)
*H01L 21/02* (2006.01)
*H01L 29/16* (2006.01)
*H01L 29/45* (2006.01)
*H01L 29/872* (2006.01)

(52) U.S. Cl.
CPC ...... *H01L 21/0485* (2013.01); *H01L 21/02529* (2013.01); *H01L 21/02664* (2013.01); *H01L 21/428* (2013.01); *H01L 29/1608* (2013.01); *H01L 29/45* (2013.01); *H01L 29/872* (2013.01)

(58) Field of Classification Search
CPC .................. H01L 21/02529; H01L 21/02664; H01L 21/0485; H01L 21/428; H01L 29/1608; H01L 29/45; H01L 29/872
See application file for complete search history.

(56) References Cited

U.S. PATENT DOCUMENTS 6,815,323 B1 * 11/2004 Lu ........................ H01L 21/0485
257/77
8,450,196 B2 * 5/2013 Rupp .................. H01L 21/0495
257/E21.064

(Continued)

FOREIGN PATENT DOCUMENTS

JP 2004-335815 A 11/2004
JP 2006-41248 A 2/2006

(Continued)

*Primary Examiner* — Allan R Wilson
(74) *Attorney, Agent, or Firm* — Hauptman Ham, LLP (57) ABSTRACT

A method of manufacturing a semiconductor device includes the steps of: forming a semiconductor layer on a first main surface of a semiconductor substrate made of crystals having a wide band gap; forming lattice defects on a second main surface on a side opposite to the first main surface of the semiconductor substrate; and emitting a laser beam having a longer wavelength than an absorption edge wavelength which is a wavelength of a light having the lowest energy which the crystals absorb, to a lower surface of the semiconductor substrate after the step of forming the lattice defects; and forming an electrode on the second main surface of the semiconductor substrate after the step of emitting the laser beam.

10 Claims, 4 Drawing Sheets

(56) References Cited

U.S. PATENT DOCUMENTS

| | | | |
|---|---|---|---|
| 8,617,669 B1 * | 12/2013 | Quick | H01L 21/02381 427/248.1 |
| 8,617,965 B1 * | 12/2013 | Quick | H01L 21/02381 438/478 |
| 2008/0099769 A1 * | 5/2008 | Rupp | H01L 21/0495 257/77 |
| 2011/0031504 A1 * | 2/2011 | Quick | H01L 21/02381 257/77 |
| 2011/0306188 A1 | 12/2011 | Kawai et al. | |
| 2013/0193449 A1 * | 8/2013 | Rupp | H01L 21/0495 257/77 |
| 2013/0285070 A1 * | 10/2013 | Kawai | H01L 21/0455 257/77 |

FOREIGN PATENT DOCUMENTS

| | | |
|---|---|---|
| JP | 2011-219297 A | 11/2011 |
| JP | 2012-004185 A | 1/2012 |

\* cited by examiner

METHOD OF MANUFACTURING SEMICONDUCTOR DEVICE AND SEMICONDUCTOR DEVICE

RELATED APPLICATIONS

The present application is a National Phase of International Application Number PCT/JP2013/066453, filed Jun. 14, 2013.

Technical Field

The present invention relates to a method of manufacturing a semiconductor device and a semiconductor device.

BACKGROUND ART

Conventionally, there has been known a method of manufacturing a semiconductor device which can acquire an ohmic contact with respect to a wide-band-gap semiconductor substrate.

For example, patent literature 1 discloses a method of manufacturing a semiconductor device which includes: a step of roughening a state of an exposed surface of an $n^+$-type SiC layer; and a step of forming an electrode on the roughened exposed surface of the $n^+$-type SiC layer 1, wherein the surface roughening step is polishing of the exposed surface or the emission of a laser beam to the exposed surface.

PRIOR ART LITERATURE

Patent Literature

Patent Literature 1: JP-A-2006-41243

SUMMARY OF THE INVENTION

Technical Problem

However, in the above-mentioned method of manufacturing a semiconductor device, for example, when a laser beam is emitted to a SiC substrate having the 4H crystal structure, an absorption edge wavelength of the SiC substrate is approximately 380 nm and hence, it is necessary to emit a laser beam having a wavelength shorter than 380 nm.

Here, the absorption edge wavelength of the Sic substrate is a wavelength of a light having lowest energy which the SiC substrate absorbs. As a laser which emits a laser beam having a wavelength shorter than 380 nm, a helium cadmium laser (He—Cd laser, wavelength: 325 nm), a nitrogen laser (N2 laser, wavelength: 350 nm) and the like are named.

To acquire an ohmic contact, it is necessary to use these lasers with high output power. However, a laser which can generate high output power at a wavelength shorter than 380 nm is costly. Accordingly, when a semiconductor device is manufactured using such a laser, there arises a drawback that a manufacturing cost of the semiconductor device is pushed up.

The present invention has been made in view of the above-mentioned drawbacks, and it is an object of the present invention to provide a method of manufacturing a semiconductor device and a semiconductor device which can acquire an ohmic contact with respect to a semiconductor substrate while reducing a manufacturing cost.

Solution to Problem

A method of manufacturing a semiconductor device according to one aspect of the present invention includes the steps of:

forming a semiconductor layer on a first main surface of a semiconductor substrate made of crystals having a wide band gap;

forming lattice defects on a second main surface on a side opposite to the first main surface of the semiconductor substrate;

emitting a laser beam having a longer wavelength than an absorption edge wavelength which is a wavelength of a light having the lowest energy which the crystals absorb, to the second main surface of the semiconductor substrate after the step of forming the lattice defects; and forming an electrode on the second main surface of the semiconductor substrate after the step of emitting the laser beam.

According to one mode of the method of manufacturing a semiconductor device of the present invention, the lattice defects are a lamination defect.

According to another mode of the method of manufacturing a semiconductor device of the present invention, the step of forming lattice defects is a step of locally applying a force to the second main surface of the semiconductor substrate.

According to another mode of the method of manufacturing a semiconductor device of the present invention, the step of forming lattice defects is a step of grinding the second main surface of the semiconductor substrate.

According to another mode of the method of manufacturing a semiconductor device of the present invention, the step of forming lattice defects is a step of sputtering the second main surface of the semiconductor substrate.

According to another mode of the method of manufacturing a semiconductor device of the present invention, the step of emitting a laser beam is a step of emitting a laser beam having energy of 0.2 J or more per square centimeter.

According to another mode of the method of manufacturing a semiconductor device of the present invention, a shape of the laser beam emitted to the second main surface of the semiconductor substrate is a circular shape or a linear shape.

According to another mode of the method of manufacturing a semiconductor device of the present invention, the laser beam is a laser beam emitted from an argon ion laser.

According to another mode of the method of manufacturing a semiconductor device of the present invention, the laser beam is a laser beam emitted from a YAG laser or a SHG green laser.

According to another mode of the method of manufacturing a semiconductor device of the present invention, the crystals are made of silicon carbide or gallium nitride.

A semiconductor device according to another aspect of the present invention includes:

a semiconductor substrate made of crystals having a wide gap;

a semiconductor layer formed on a first main surface of the semiconductor substrate; and an electrode formed on a second main surface of the semiconductor substrate on a side opposite to the first main surface, wherein the semiconductor substrate includes a conductive layer formed on a second main surface side of the semiconductor substrate by emitting a laser beam having a longer wavelength than an absorption edge wavelength which is a wavelength of a light having the lowest energy which the crystals absorb, to the second main surface of the semiconductor substrate after forming a lattice defect on a second main surface side of the semiconductor substrate, and the electrode is formed after the laser beam is emitted to the second main surface.

The method of manufacturing a semiconductor device according to one aspect of the present invention includes the steps of: forming a semiconductor layer on a first main surface of a semiconductor substrate made of crystals having a wide band gap; forming lattice defects on a second main surface on a side opposite to the first main surface of the semiconductor substrate; and emitting a laser beam having a longer wavelength than an absorption edge wavelength which is a wavelength of a light having the lowest energy which the crystals absorb, to the second main surface of the semiconductor substrate after the step of forming the lattice defects; and forming an electrode on the second main surface of the semiconductor substrate after the step of emitting the laser beam. By forming lattice defects on the second main surface in this manner, a laser beam having a longer wavelength than an absorption edge wavelength of the crystals can be absorbed at the position where the lattice defects of the semiconductor substrate are formed. As the laser beam is absorbed at the position where the lattice defects are formed, some elements which constitute the semiconductor substrate are evaporated so that a conductive layer is formed on the second main surface side of the semiconductor substrate.

By forming the electrode on the second main surface of the semiconductor substrate after the conductive layer is formed, the semiconductor substrate and the electrode can acquire a favorable ohmic contact.

Further, a laser which uses a laser beam having a longer wavelength than an absorption edge wavelength used for forming the conductive layer is inexpensive and hence, a manufacturing cost of a semiconductor device can be reduced.

Accordingly, the method of manufacturing a semiconductor device of the present invention can acquire an ohmic contact to the semiconductor substrate while reducing a manufacturing cost.

Further, a laser beam having a longer wavelength than an absorption edge wavelength is emitted after lattice defects are formed on a surface side of the second main surface on a side opposite to the first main surface of the semiconductor substrate where the semiconductor layer is formed. Accordingly, the emitted laser beam is absorbed by the lattice defect. Since the laser beam does not reach the semiconductor layer, it is possible to prevent the semiconductor layer from being damaged by the laser beam.

DESCRIPTION OF EMBODIMENTS

Hereinafter, an embodiment of the present invention is explained in conjunction with drawings. In this embodiment, the explanation is made by taking a Schottky diode as one example of a device which includes a wide-band-gap semiconductor substrate. A wide band gap is a band gap larger than at least a band gap 1.12 eV of silicon. The wide-band-gap semiconductor substrate is, for example, a substrate made of a group III-V semiconductor. The group III-V semiconductor may be SiC, GaN or the like. In this embodiment, the explanation is made by taking a SiC substrate as one example of the wide-band-gap semiconductor substrate.

Figure 1:
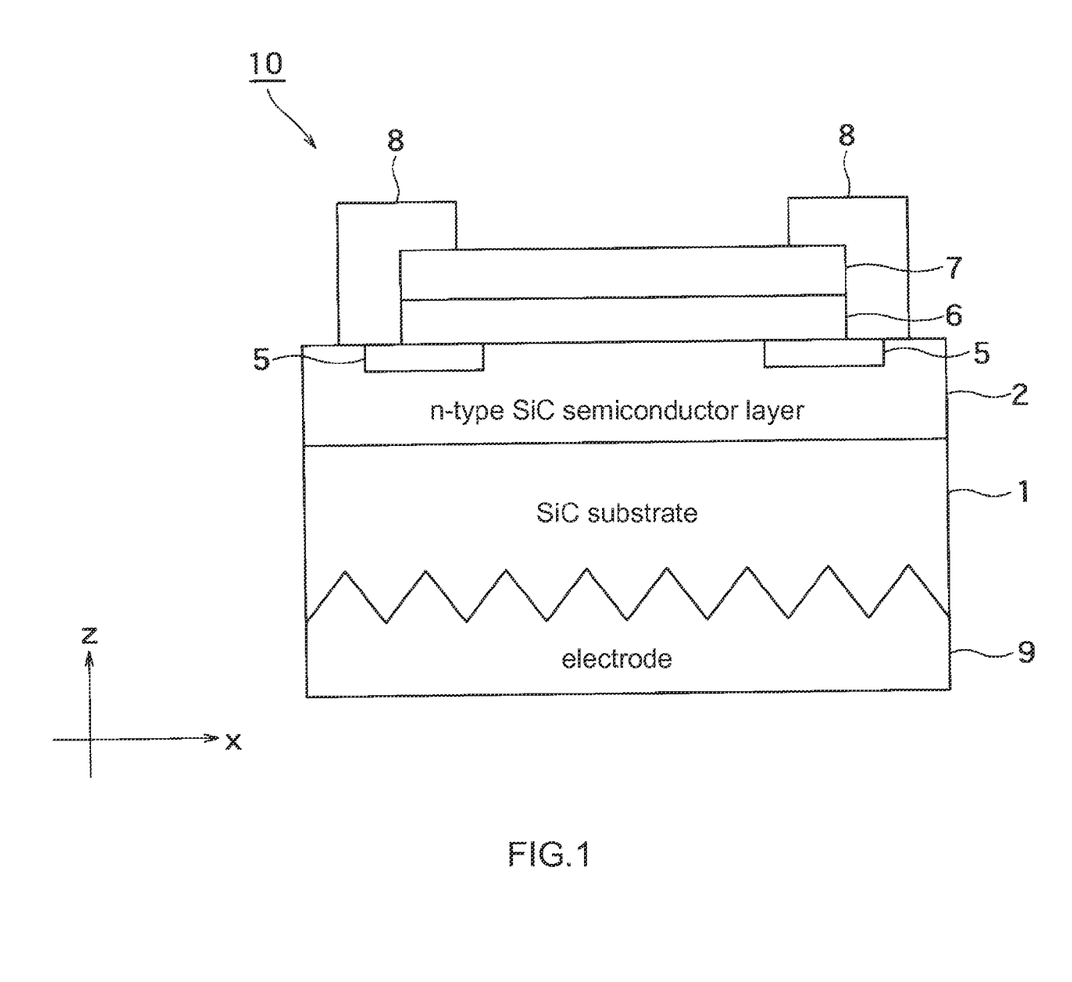
FIG. 1 is a schematic cross-sectional view of a semiconductor device 10 according to one embodiment of the present invention.

On an x-z coordinate system shown in FIG. 1, a positive side of a z axis is an anode side, and a negative side of the z axis is a cathode side. A semiconductor device 10 according to one embodiment of the present invention includes, as shown in FIG. 1, a SiC substrate 1 and an n-type SiC semiconductor layer 2 formed on an anode-side surface (first main surface) of the SiC substrate 1. On an anode-side surface of the n-type SiC semiconductor layer 2, a ring-shaped p-type SiC layer 5 having a center axis thereof directed in the direction (the z-axis direction) perpendicular to the first main surface is formed.

The semiconductor device 10 further includes a Schottky electrode 6 formed on an anode-side surface of the n-type SiC semiconductor layer 2 surrounded by the p-type SiC layer 5 and on a portion of an anode-side surface of the p-type SiC layer 5. The semiconductor device 10 further includes a lead electrode 7 formed on an anode side of the Schottky electrode 6.

The semiconductor device 10 further includes an insulator 8 which is formed on the surface of the n-type SiC semiconductor layer 2 including an outer peripheral surface of the p-type SiC layer 5. The insulator 8 is formed into a ring shape having a center axis thereof directed in the direction perpendicular to the anode-side surface of the n-type SiC semiconductor layer 2 so as to cover a side surface of the Schottky electrode 6, a side surface of the lead electrode 7 and an outer periphery of front surface of the lead electrode 7.

The semiconductor layer 10 further includes an electrode 9 formed on a cathodes-side surface (second main surface) of the SiC substrate 1. The second main surface is a surface of the SiC substrate 1 disposed on a side opposite to the first main surface.

The above-described SiC substrate 1 is a semiconductor substrate made of SiC crystal having a wide band gap. The SiC substrate 1 is a semiconductor substrate including a conductive layer which is formed on the above-mentioned second main surface side by emitting a laser beam having a longer wavelength than an absorption edge wavelength which is a wavelength of light of the lowest energy which the above-mentioned crystal absorbs, to the above-mentioned second main surface after lattice defects are formed on the second main surface side.

The SiC substrate 1 is formed of, for example, an n-type semiconductor containing an impurity at a high concentration, and has a low resistance characteristic.

Further, the n-type SiC semiconductor layer 2 is formed of, for example, an n-type semiconductor containing an impurity at low concentration, and has a high resistance characteristic. The n-type SiC semiconductor layer 2 has an impurity concentration and a thickness necessary for ensuring predetermined breakdown strength, for example.

Although the p-type SiC layer 5 is shown in a split-in-two manner in FIG. 1 which is a cross-sectional view, the p-type SiC layer 5 is formed as an integral body in an actual structure. The p-type SiC layer 5 is formed by injecting aluminum (Al) or boron (B) into an area of the n-type SiC semiconductor layer 2 by ion implantation and, thereafter, by activating such an area at a temperature of 1500° C. or more.

The Schottky electrode 6 is made of either one of titanium (Ti), molybdenum (Mo), nickel (Ni) and the like, or an alloy of these materials, for example.

The lead electrode 7 may be made of any material provided that a Schottky contact can be formed. The lead electrode 7 is made of any one of the following: aluminum (Al), gold (Au) and the like, or an alloy of these materials, for example.

Although the insulator 8 is shown in a split-in-two manner in FIG. 1 which is a cross-sectional view, the insulator 8 is formed as an integral body in an actual structure. The insulator 8 is made of silicon oxide, silicon nitride, polyimide or the like, for example.

The n-type SiC semiconductor layer 2, the p-type SiC layer 5, the Schottky electrode 6, the lead electrode 7, and the insulator 8 constitute a device (Schottky diode) including the SiC substrate 1.

Next, a method of manufacturing the semiconductor device 10 having the above-mentioned constitution according to this embodiment is explained in conjunction with FIG. 2 to FIG. 6.

Figure 2:
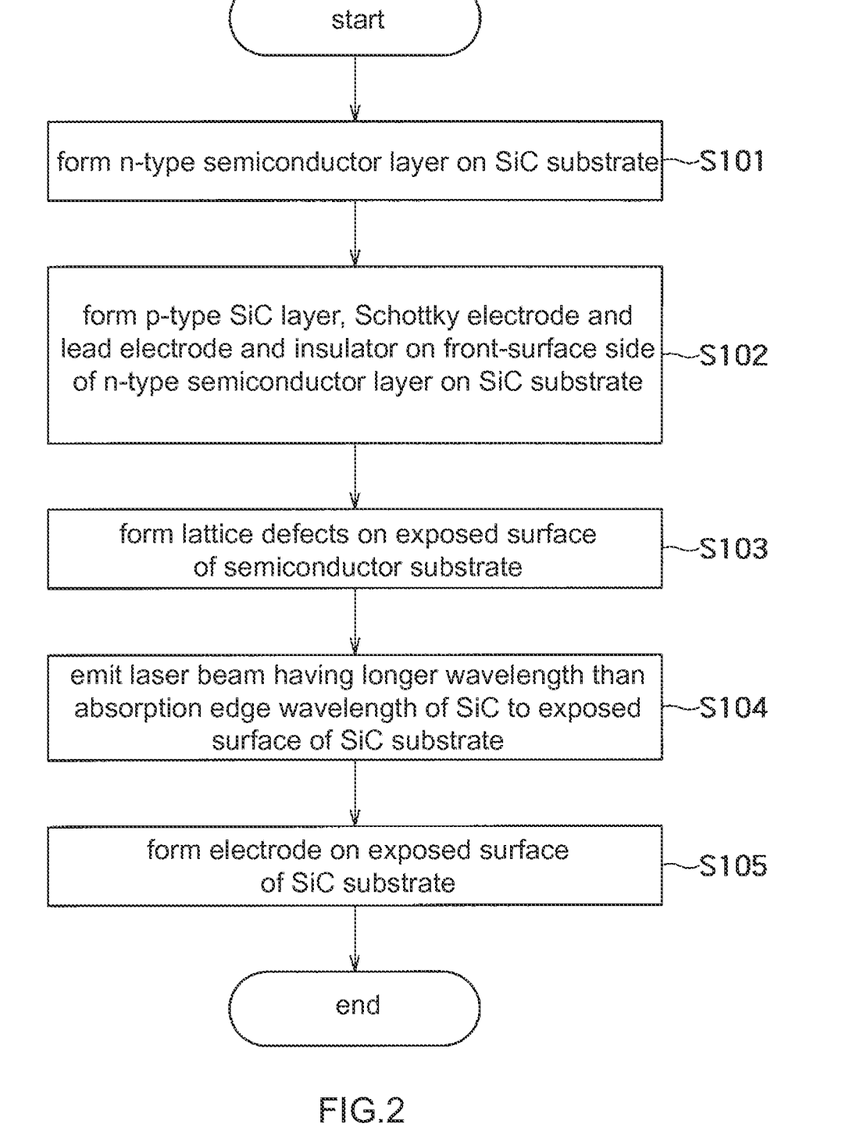
FIG. 2 is a flowchart showing one example of a method of manufacturing the semiconductor device 10.
Figure 3:
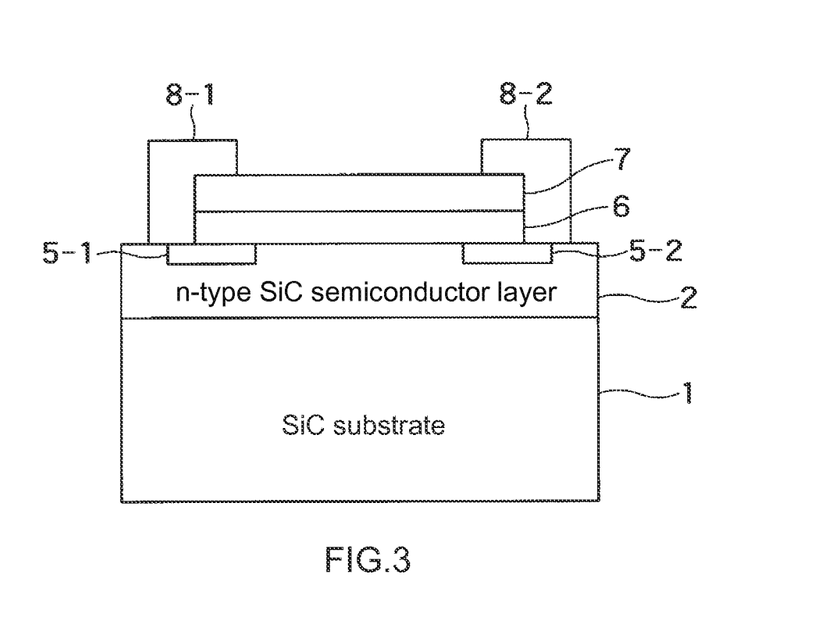
FIG. 3 is a schematic cross-sectional view showing a first step of the method of manufacturing the semiconductor device 10 according to one embodiment of the present invention.

As shown in a flowchart of FIG. 2, firstly, a semiconductor layer is formed on a semiconductor substrate which is made of a crystal having a wide band gap. In this embodiment, as one example, the n-type SiC semiconductor layer 2 is formed on the first main surface of the SiC substrate 1 by an epitaxial method, for example (step S101).

Next, the p-type SiC layer 5, the Schottky electrode 6, the lead electrode 7, and the insulator 8 are formed on a front surface side of the n-type SiC semiconductor layer 2 (step S102).

Figure 4:
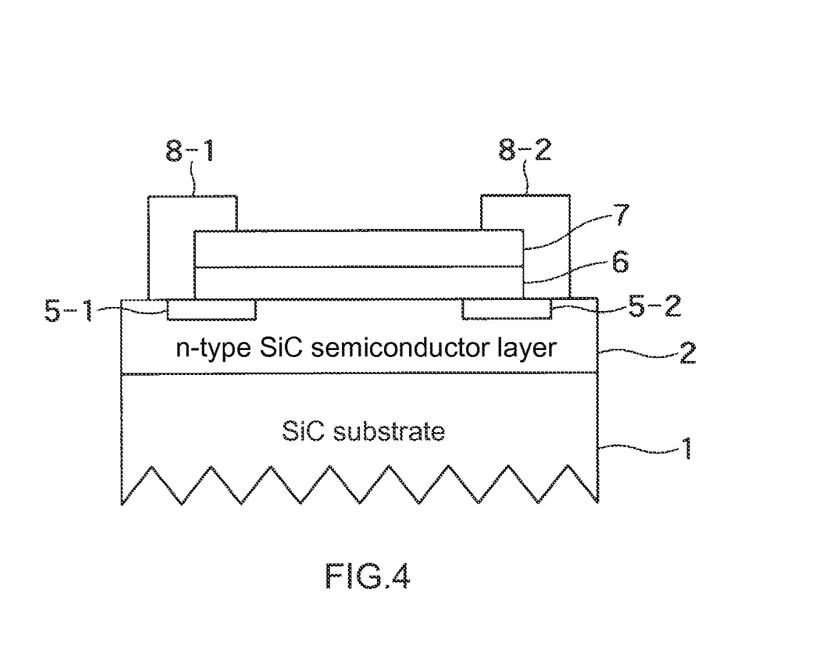
FIG. 4 is a schematic cross-sectional view showing a second step of method of manufacturing the semiconductor device 10 according to one embodiment of the present invention.

Next, lattice defects are formed on the second main surface side of the SiC substrate 1. As the lattice defects, point defects, line defects and plane defect are considered, and as the plane defects, lamination defects are considered. The lattice defects can be formed by locally applying a force to the second main surface of the SiC substrate 1, for example. In this embodiment, as one example, lattice defects are formed by grinding the second main surface of the SiC substrate 1. The surface roughness of the second main surface after grinding is preferably set to 5 nm or more. Due to such a treatment, as shown in FIG. 4 which is a schematic cross-sectional view of the semiconductor device 10, lattice defects are formed on the second main surface of the SiC substrate 1. The lattice defects may be point defects or line defects.

In this embodiment, as one example, SiC crystal has the 4H crystal structure, and an absorption edge wavelength of SiC crystal is approximately 380 nm. At portions where the lattice defects are formed, an absorption wavelength band is shifted to a long wavelength side and hence, a laser beam having a longer wavelength than an absorption edge wavelength of SiC crystal having the 4H crystal structure (here, approximately 380 nm as one example) is absorbed. The lattice defects may be formed by sputtering the second main surface of the SiC substrate 1.

Figure 5:
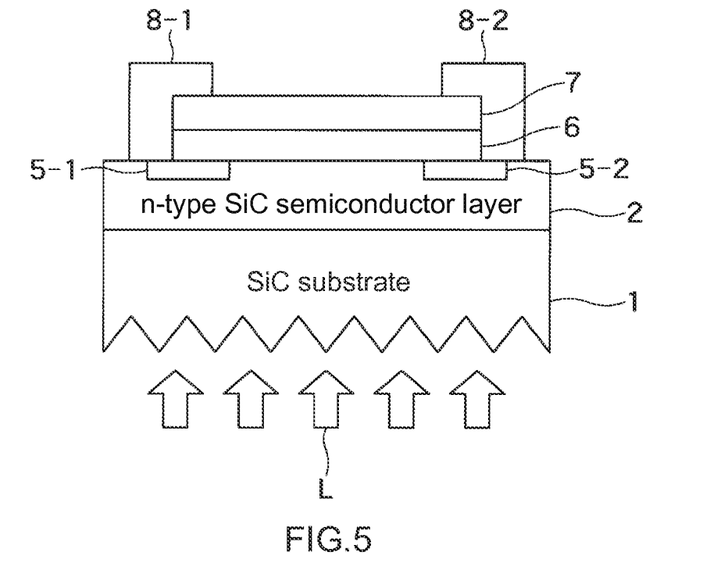
FIG. 5 is a schematic cross-sectional view showing a third step of the method of manufacturing the semiconductor device 10 according to one embodiment of the present invention.

Next, as shown in FIG. 5, a laser beam L having a longer wavelength than an absorption edge wavelength of SiC crystal is emitted to the second main surface of the SiC substrate 1 (step S104). As described previously, in this embodiment, SiC crystal has the 4H crystal structure as one example and hence, a laser beam emitted from a laser and having a longer wavelength than an absorption edge wavelength of 380 nm is emitted to the second main surface of the SiC substrate 1. As a laser beam having a longer wavelength than the absorption edge wavelength 380 nm, for example, a green laser beam (having a wavelength of approximately 532 nm), an argon ion laser beam having a wavelength of 488.0 nm, an argon ion laser beam having a wavelength of 514.5 nm, a YAG laser beam having a wavelength of 532 nm, a SHG (Second Harmonic Generation) green laser beam and the like are named. At the time of emitting a laser beam, it is preferable that a laser beam is emitted to the above-mentioned second main surface with energy of 0.2 J or more per square centimeter.

Further, in this embodiment, as one example, a shape of an emission surface of a laser beam on the second main surface is a circular shape, a long diameter of the laser beam in cross section is 50 μm, and a laser beam is emitted to the second main surface every time the position to which a laser beam is emitted is displaced by 50 μm. Here, "circular shape" means not only a true circle but also an ellipse. Due to such an laser beam emitting operation, a laser beam is emitted to the whole second main surface of the SiC substrate 1.

Since a laser beam emitted to the second main surface of the SiC substrate 1 is absorbed at positions where lattice defects are formed, silicon contained in SiC crystal which constitutes the SiC substrate 1 is evaporated so that a conductive layer made of graphite is formed on a front surface side of the second main surface of the SiC substrate 1.

In this embodiment, as one example, the shape of the emission surface of the laser beam on the second main surface is set to a circular shape. However, the shape of the emission surface of the laser beam on the second main surface is not limited to a circular shape and may also be a linear shape. Further, the crystal structure of SiC crystal is not limited to the 4H crystal structure and may be the 6H crystal structure.

Figure 6:
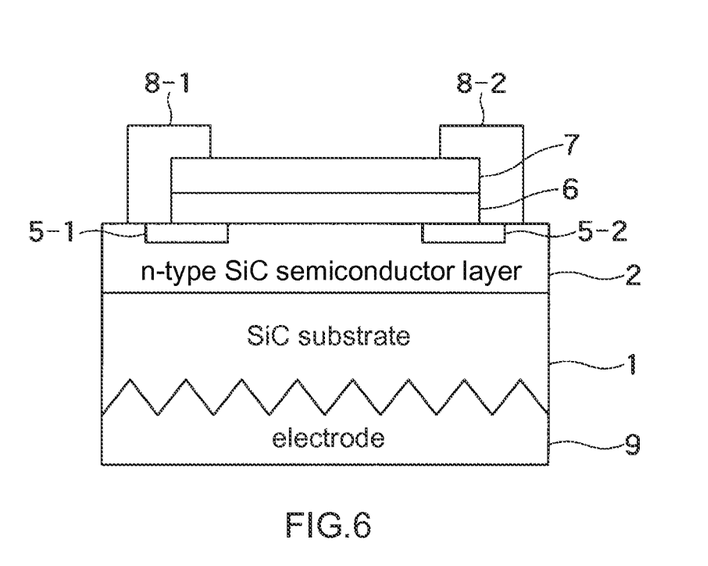
FIG. 6 is a schematic cross-sectional view showing a fourth step of the method of manufacturing the semiconductor device 10 according to one embodiment of the present invention.

Next, the electrode 9 is formed on the second main surface of the SiC substrate 1. Accordingly, as shown in FIG. 6 which is a schematic cross-sectional view of the semiconductor device 10, the electrode 9 is formed on the second main surface of the SiC substrate 1 (step S105).

As described above, the method of manufacturing a semiconductor device according to one embodiment of the present invention includes the steps of: forming the semiconductor layer on the first main surface of the semiconductor substrate which is made of crystal having a wide band gap; forming lattice defects on the second main surface side of the semiconductor substrate on a side opposite to the first main surface; emitting a laser beam having a longer wavelength than an absorption edge wavelength which is a wavelength of light having a lowest energy which the above-mentioned crystal can absorb, to the second main surface of the semiconductor substrate after the step of forming the lattice defects; and forming the electrode on the second main surface of the semiconductor substrate after the step of emitting the laser beam.

As described above, by forming lattice defects, a laser beam having a longer wavelength than an absorption edge wavelength of the above-mentioned crystal is absorbed at positions of the semiconductor substrate where the lattice defects are formed. Further, since a laser beam is absorbed at positions where the lattice defects are formed, some of the elements which constitute the semiconductor substrate are evaporated so that a conductive layer is formed on a second main surface side of the semiconductor substrate. As in the case of this embodiment, when crystal having a wide band gap is silicon carbide (SiC), a laser beam having a longer wavelength than the above-mentioned absorption edge wavelength is absorbed at positions where lattice defects are formed and hence, silicon is evaporated so that a conductive layer made of graphite is formed on a front surface side of the second main surface of the semiconductor substrate.

Since the electrode is formed on the second main surface of the semiconductor substrate after the conductive layer is formed as described above, it is possible to form a favorable ohmic contact between the above-mentioned semiconductor substrate and the electrode. Further, a laser which emits a laser beam having a longer wavelength than an absorption edge wavelength which is used in forming the conductive layer (for example, an argon ion laser which emits a laser beam having a wavelength of 488.0 nm or a wavelength of 514.5 nm, a YAG laser which emits a laser beam having a wavelength of 532 nm or the like), or an SHG green laser is cheaper than a laser which emits a laser beam having a wavelength shorter than 380 nm (for example, a helium cadmium laser or a nitrogen laser). As a result, a manufacturing cost of a semiconductor device can be reduced by manufacturing the semiconductor device using such a laser. Accordingly, a method of manufacturing a semiconductor device of the present invention can form an ohmic contact with respect to a semiconductor substrate while reducing a manufacturing cost of the semiconductor device.

Further, the method of manufacturing a semiconductor device according to one embodiment of the present invention includes the step of emitting a laser beam having a longer wavelength than an absorption edge wavelength to the second main surface after lattice defects are formed on a second main surface side of the semiconductor substrate on a side opposite to the first main surface of the semiconductor substrate. Accordingly, a laser beam is absorbed by the lattice defects and does not arrive at the semiconductor layer and hence, it is possible to prevent the semiconductor layer from being damaged by a laser beam.

In this embodiment, although the explanation has been made by taking a Schottky diode as one example of the semiconductor device, the present invention is not limited to a Schottky diode and is applicable to various diodes. Further, the present invention is also applicable to a field effect transistor (for example, an MOSFET (Metal-Oxide-Semiconductor Field-Effect Transistor) or an IGBT (Insulated Gate Bipolar Transistor)) besides the diodes.

The embodiment is merely exemplified, and the scope of the invention is not limited to the embodiment.

REFERENCE SIGNS LIST

1: SiC substrate
2: n-type SiC semiconductor layer
5, 5-1, 5-2: p-type SiC layer
6: Schottky electrode
7: lead electrode
8, 8-1, 8-2: insulator
9: electrode
10: semiconductor device

The invention claimed is:

1. A method of manufacturing a semiconductor device comprising the steps of:
forming a semiconductor layer on a first main surface of a semiconductor substrate made of crystals of silicon carbide;
forming lattice defects on a second main surface on a side opposite to the first main surface of the semiconductor substrate;
forming a conductive layer made of graphite on the second main surface by emitting a laser beam having a longer wavelength than an absorption edge wavelength, which is a wavelength of a light having the lowest energy which the crystals absorb, to the second main surface of the semiconductor substrate so that silicon is evaporated from the semiconductor substrate, after the step of forming the lattice defects; and
forming an electrode on the second main surface of the semiconductor after the step of forming a conductive layer made of graphite.

2. The method of manufacturing a semiconductor device according to claim 1, wherein the lattice defects are a lamination defect.

3. The method of manufacturing a semiconductor device according to claim 2, wherein the step of forming lattice defects is a step of locally applying a force to the second main surface of the semiconductor substrate.

4. The method of manufacturing a semiconductor device according to claim 3, wherein the step of forming lattice defects is a step of grinding the second main surface of the semiconductor substrate.

5. The method of manufacturing a semiconductor device according to claim 1, wherein the step of forming lattice defects is a step of sputtering the second main surface of the semiconductor substrate.

6. The method of manufacturing a semiconductor device according to claim 1, wherein the step of emitting a laser beam is a step of emitting a laser beam having energy of 0.2 J or more per square centimeter.

7. The method of manufacturing a semiconductor device according to claim 1, wherein a shape of the laser beam emitted to the second main surface of the semiconductor substrate is a circular shape or a linear shape.

8. The method of manufacturing a semiconductor device according to claim 1, wherein the laser beam is a laser beam emitted from an argon ion laser.

9. The method of manufacturing a semiconductor device according to claim 1, wherein the laser beam is a laser beam emitted from a YAG laser or a SHG green laser.

10. A semiconductor device comprising:
a semiconductor substrate made of crystals of silicon carbide;
a semiconductor layer formed on a first main surface of the semiconductor substrate; and
an electrode formed on a second main surface of the semiconductor substrate on a side opposite to the first main surface, wherein
the semiconductor substrate includes a conductive layer made of graphite formed on a second main surface side of the semiconductor substrate by emitting a laser beam having a longer wavelength than an absorption edge wavelength, which is a wavelength of a light having the lowest energy which the crystals absorb, to the second main surface of the semiconductor substrate so that silicon is evaporated from the semiconductor substrate, after forming a lattice defect on a second main surface side of the semiconductor substrate, and
the electrode is formed after the conductive layer made of graphite is formed by emitting the laser beam to the second main surface.

* * * * *

UNITED STATES PATENT AND TRADEMARK OFFICE
CERTIFICATE OF CORRECTION

| | | |
|---|---|---|
| PATENT NO. | : 9,245,753 B2 | Page 1 of 1 |
| APPLICATION NO. | : 14/407457 | |
| DATED | : January 26, 2016 | |
| INVENTOR(S) | : Yusuke Fukuda | |

It is certified that error appears in the above-identified patent and that said Letters Patent is hereby corrected as shown below:

In the claims,

Column 8, Line 13, change "semiconductor after the step of forming a conductive" to
-- semiconductor substrate after the step of forming a conductive --

Signed and Sealed this
Twenty-eighth Day of June, 2016

Michelle K. Lee
*Director of the United States Patent and Trademark Office*